United States Patent
Lai et al.

(10) Patent No.: US 7,989,837 B2
(45) Date of Patent: Aug. 2, 2011

(54) LIGHT CHAIN

(75) Inventors: Chih-Ming Lai, Miao-Li Hsien (TW); Tse-An Lee, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 493 days.

(21) Appl. No.: 12/210,489

(22) Filed: Sep. 15, 2008

(65) Prior Publication Data

US 2009/0159903 A1 Jun. 25, 2009

(30) Foreign Application Priority Data

Dec. 19, 2007 (CN) .......................... 2007 1 0203256

(51) Int. Cl.
*H01L 33/00* (2010.01)
(52) U.S. Cl. ............... 257/99; 257/88; 257/E33.062; 257/E33.058; 257/E33.059; 257/E33.061; 257/E33.066; 257/E33.074; 257/E33.056
(58) Field of Classification Search .............. 257/88, 257/99, E33.056, E33.062, E33.058, E33.059, 257/E33.061, E33.066, E33.074
See application file for complete search history.

(56) References Cited

U.S. PATENT DOCUMENTS

| | | | |
|---|---|---|---|
| 6,147,367 A * | 11/2000 | Yang et al. ...................... | 257/88 |
| 6,186,645 B1 | 2/2001 | Camarota | |
| 6,335,548 B1 * | 1/2002 | Roberts et al. .................. | 257/98 |
| 7,265,496 B2 | 9/2007 | Allen | |
| 7,285,801 B2 * | 10/2007 | Eliashevich et al. ............ | 257/96 |
| 2002/0004251 A1 * | 1/2002 | Roberts et al. .................. | 438/26 |
| 2009/0141493 A1 * | 6/2009 | Stoyan ..................... | 362/249.02 |
| 2009/0272986 A1 * | 11/2009 | Chan et al. ....................... | 257/88 |

FOREIGN PATENT DOCUMENTS

| | | |
|---|---|---|
| CN | 1383219 A | 12/2002 |
| CN | 2694096 Y | 4/2005 |
| CN | 2766345 Y | 3/2006 |
| CN | 2779218 Y | 5/2006 |
| CN | 2849440 Y | 12/2006 |
| CN | 2890603 Y | 4/2007 |

* cited by examiner

*Primary Examiner* — Hrayr A Sayadian
(74) *Attorney, Agent, or Firm* — Clifford O. Chi

(57) ABSTRACT

A light chain includes a plurality of light emitting diodes (LEDs) electrically connected to each other. Each LED includes an LED chip having a first pole and a second pole, and a packaging layer encapsulating the LED chip. A first electrode has an inner end connected to the first pole, and an outer end extending to the outside of the packaging layer. A second electrode has an inner end connected to the second pole, and an outer end extending to the outside of the packaging layer. A third electrode has a first outer end and a second outer end located at the outside. The outer end of the first electrode and the first outer end cooperatively form a first plug; the outer end of the second electrode and the second outer end cooperatively form a second plug configured to attach to a first plug of an adjacent LED.

17 Claims, 4 Drawing Sheets

LIGHT CHAIN

BACKGROUND

1. Field of the Invention

The present invention generally relates to light chains, and particularly to a light chain incorporating light emitting diodes.

2. Description of Related Art

LED light chains have been widely used for decoration, especially during Christmas or other festivals, due to their reliability, energy savings, and low power consumption.

An LED light chain usually consists of a plurality of LEDs. Each LED includes an LED die and a packaging layer protectively packaging the LED die. A pair of electrodes extend outwardly from the packaging layer to electrically connect the LED chip to a power source, so that electrical current can be supplied to the LED chip to cause the LED chip to emit light. When the LEDs are assembled, a thread (not shown) is used to electrically connect the LEDs together. A plurality of sockets are formed on the thread. The electrodes of each LED are inserted into a corresponding socket. However, the quantity or the modality of the LEDs for the light chains in different situations are different. Thus, each light chain needs a thread to assemble the different LEDs. Thus, assembly of the LEDs to form the light chains is difficult due to the complexity of the connection.

Therefore, a light chain is desired for overcoming the described limitations.

SUMMARY

In accordance with the present embodiment, a light chain includes a plurality of light emitting diodes (LEDs) electrically connected to each other. Each LED includes an LED chip having a first pole and a second pole, and a packaging layer encapsulating the LED chip. A first electrode has an inner end received in the packaging layer and electrically connected to the first pole of the LED chip, and an outer end extending through the packaging layer to the outside. A second electrode has an inner end received in the packaging layer and electrically connected to the second pole of the LED chip, and an outer end extending through the packaging layer to the outside. A third electrode extends through the packaging layer, and has a first outer end and a second outer end located at the outside of the packaging layer. The outer end of the first electrode and the first outer end of the third electrode cooperatively form a first plug; the outer end of the second electrode and the second outer end of the third electrode cooperatively form a second plug. The first plug is configured to attach to a second plug of an adjacent light emitting diode.

Other advantages and novel features of the present invention will be drawn from the following detailed description of a preferred embodiment of the present invention with attached drawings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION OF THE INVENTION

Figure 1:
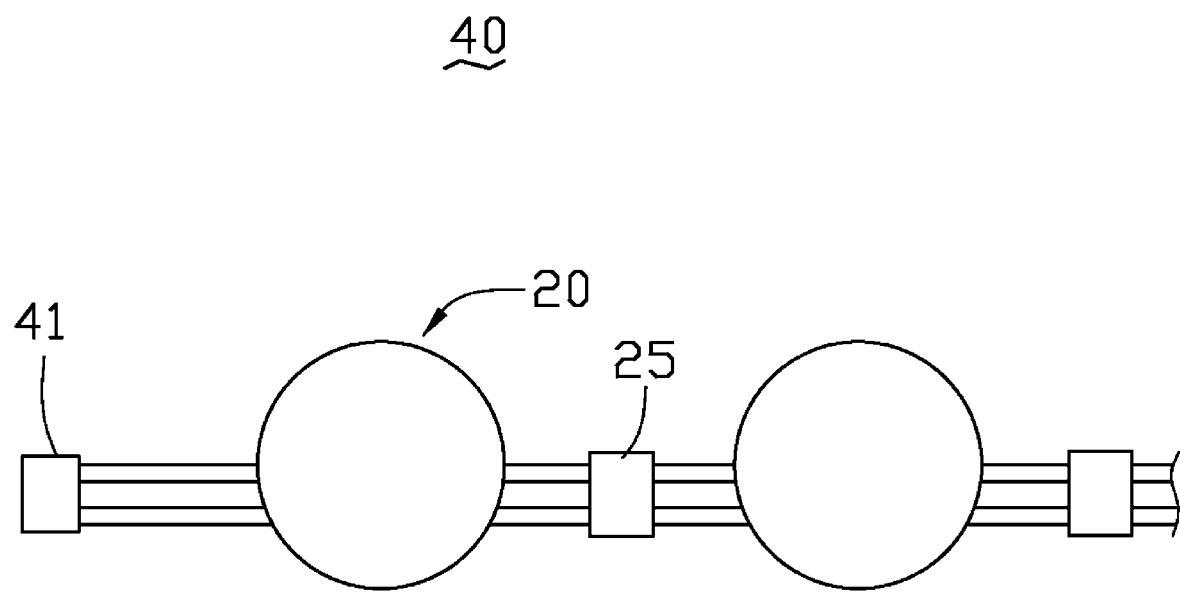
FIG. 1 is an assembled view of one embodiment of a light chain, the light chain including a plurality of light emitting diodes.
Figure 2:
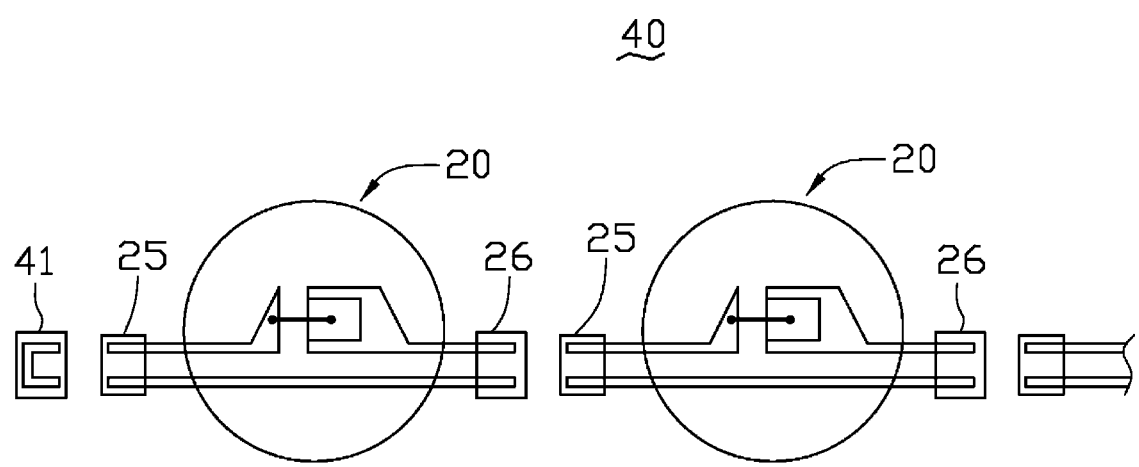
FIG. 2 is an exploded view of the light chain of FIG. 1.

Referring to FIGS. 1 and 2, the light chain 40 includes a plurality of light emitting diodes (LEDs) 20 connected to each other, and a connector 41.

Figure 3:
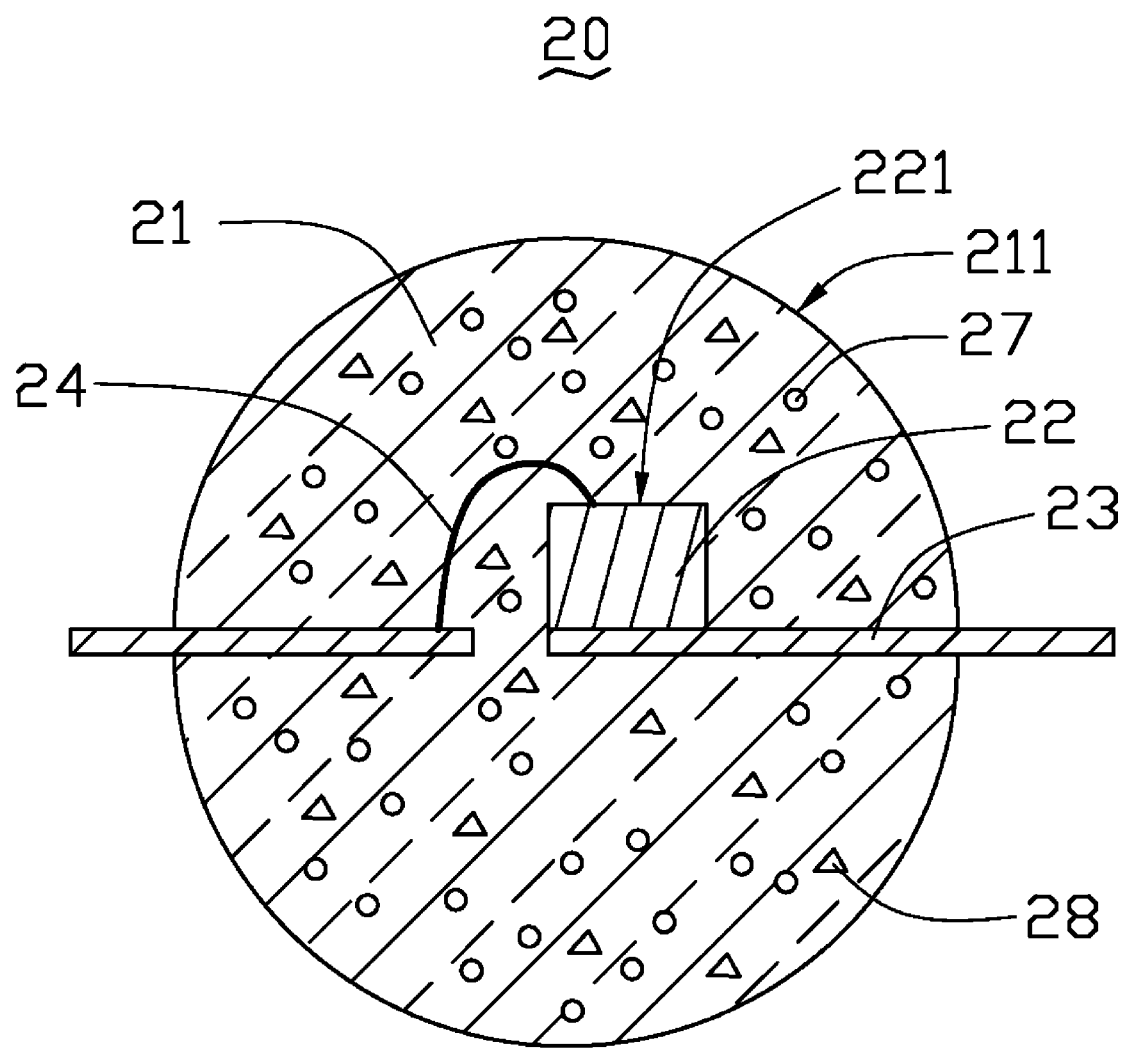
FIG. 3 is a cross sectional view of one of the light emitting diodes of the light chain of FIG. 1.

Referring to FIG. 3, each LED 20 includes an LED chip 22, a packaging layer 21, and a lead frame 23. The LED chip 22 has a pair of electrodes for electrically connecting the LED chip 22 to a power source (not shown). The packaging layer 21 may be spherical, and the LED chip 22 may be arranged at a center of the packaging layer 21. The packaging layer 21 is made of a transparent material, such as silicone, epoxy resin, and glass. A light emitting surface 211 is formed on an outer surface of the packaging layer 21. In one embodiment a plurality of granules 27 may be dispersed in the packaging layer 21 to enhance diffusion of the packaging layer 21, whereby light emitted by the LED chip 22 transverses through the packaging layer 22 approximately in all directions. In another embodiment, the granules 27 may be arranged on an emitting surface 221 of the LED chip 22. In an advantageous embodiment, a plurality of powders 28 made of highly heat conductivity coefficient material is dispersed in the packaging layer 21. The material of the plurality of powders may be diamond powder which has a heat conductivity coefficient in range of 300-1000 W/(m·k). Thus, heat generated by the LED chip 22 can be conducted to the packaging layer 21. The light emitting surface 211 of the packaging layer 21 may be a rough surface for enhancing a heat exchange area of the packaging layer 211 and the outside.

Figure 4:
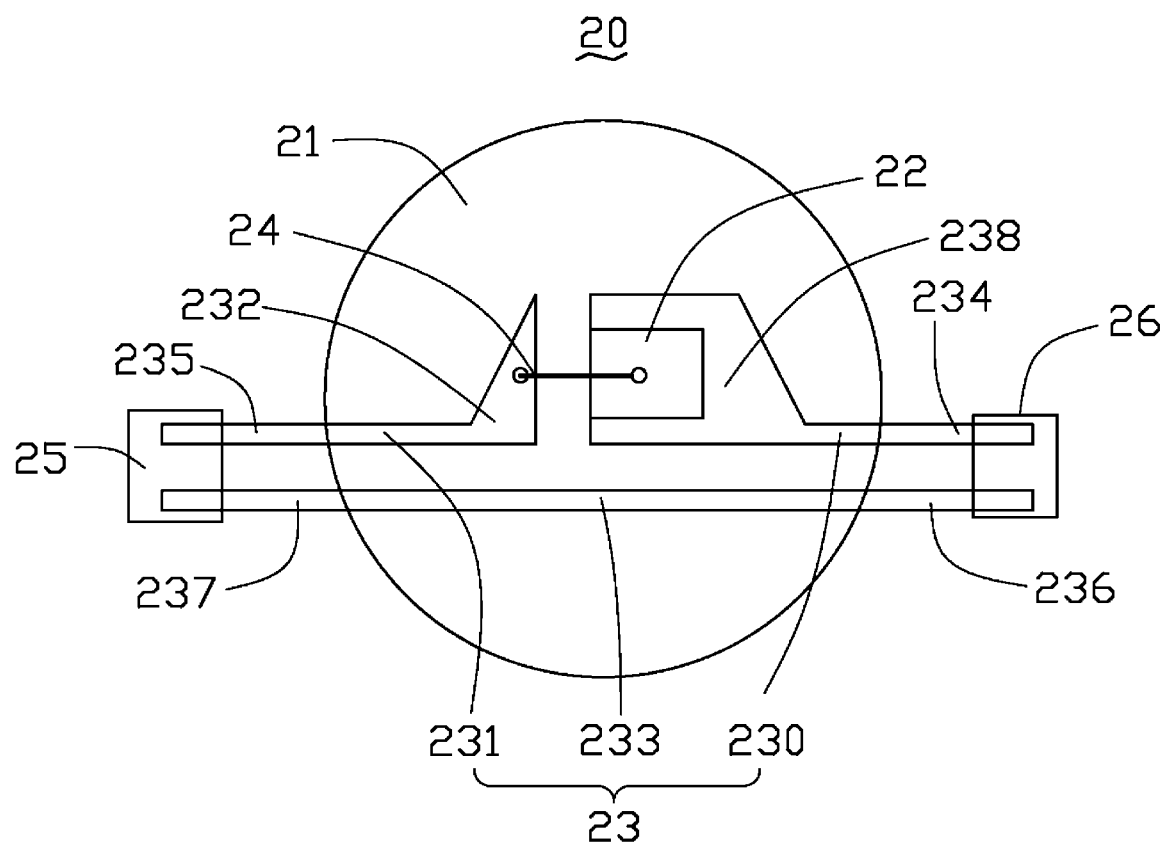
FIG. 4 is a top view of the light emitting diode of FIG. 4.

Referring to FIG. 4, the lead frame 23 includes three poles, including a first pole 231, a second pole 230, and a third pole 233. The first and second poles 231, 230 are collinear. The third pole 233 is parallel to the first and second poles 231, 230. The first pole 231 has an inner end 232 located in the packaging layer 21, and an outer end 235 that extends through the packaging layer 21 to the outside. The second pole 230 includes an inner end 238 located in the packaging layer 21 and an outer end 234 extending outwardly to the outside. The inner end 232 of the first pole 231 and the inner end 238 of the second pole 230 face each other and spaced a distance from each other. The LED chip 22 is arranged on the inner end 238 of the second pole 230. A first electrode of the LED chip 22 is electrically connected to the inner end 238 of the second pole 230, and a second electrode of the LED chip 22 is electrically connected to the inner end 232 of the first pole 231 via a thread 24 through wire bonding. The outer end 235 of the first pole 231 and the outer end 234 of the second pole 230 are located at opposite sides of the LED chip 22. The third pole 233 extends through the packaging layer 21, with two opposite outer ends including a left outer end 237 and a right outer end 236, both located at the outside. The left outer end 237 of the third pole 233 and the outer end 235 of the first pole 231 are located at the same side of the LED chip 22, and are fixed into a first holder 25 to form a first plug of the LED 20. The right outer end 236 of the third pole 233 and the outer end 234 of the second pole 230 are located at the opposite side of the LED chip 22, and are fixed into a second holder 26 to form a second plug of the LED 20.

When the LEDs 20 are connected together to form the light chain 40, the first holder 25 of one of the LEDs 20 is inserted into the second holder 26 of a neighboring LED 20. The outer end 235 of the first pole 231 of each LED 20 is electrically connected to the outer end 234 of the second pole 230 of the neighboring LED 20. The left outer end 237 of the third pole 233 of the LED 20 is electrically connected to the right outer end 236 of the third pole 233 of the neighboring LED 20. The connector 41 is electrically connected to the first plug of a leftmost LED 20, and electrically connects the outer end 235 of the first pole 231 of the leftmost LED 20 and the left outer end 237 of the third pole 233 of the leftmost LED 20. Thus, the LEDs 20 of the light chain 40 are connected in series.

When the light chain 40 is in use, the second plug of a rightmost LED 20 is electrically connected to a power source. The outer end 234 of the second pole 230 of the rightmost LED 20 is connected to the anode of the power source, and the right outer end 236 of the third pole 233 of the rightmost LED 20 is connected to the cathode of the power source. The LEDs 20, the connector 41, and the power source cooperatively form a circuit. The power source supplies electrical current to the LEDs 20 to cause the LEDs 20 to emit light. Since each LED 20 forms two plugs, each LED 20 can be connected to each other or to other electrical components. The number of the LEDs can be altered by conveniently assembling or disassembling the LEDs from the light chain.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light chain comprising a plurality of light emitting diodes electrically connected to each other, each light emitting diode comprising:
    a light emitting diode chip having a first pole and a second pole;
    a packaging layer encapsulating the light emitting diode chip;
    a first electrode having an inner end received in the packaging layer and electrically connected to the first pole of the light emitting diode chip, and an outer end extending through the packaging layer to the outside;
    a second electrode having an inner end received in the packaging layer and electrically connected to the second pole of the light emitting diode chip, and an outer end extending through the packaging layer to the outside; and
    a third electrode extending through the packaging layer, the third electrode having a first outer end located at the outside of the packaging layer and a second outer end located at the outside of the packaging layer;
    wherein the outer end of the first electrode and the first outer end of the third electrode cooperatively form a first plug; the outer end of the second electrode and the second outer end of the third electrode cooperatively form a second plug; the first plug is configured to attach to a second plug of an adjacent light emitting diode.

2. The light chain of claim 1, wherein for each light emitting diode, the first electrode, the second electrode, and the third electrode are parallel to each other.

3. The light chain of claim 2, wherein for each light emitting diode, the first and second electrodes are collinear; the inner ends of the first and second electrodes face each other and spaced a distance from each other.

4. The light chain of claim 1, wherein for each light emitting diode, the light emitting diode chip is arranged on the second electrode, and the first electrode is connected to the light emitting diode chip by wire bonding.

5. The light chain of claim 1, wherein for each light emitting diode, the outer end of the first electrode and the first outer end of the third electrode are assembled in a first holder; the outer end of the second electrode and the second outer end of the third electrode are assembled in a second holder; the first holder of the each light emitting diode is inserted into the second holder of the adjacent light emitting diode.

6. The light chain of claim 1, wherein each light emitting diode further comprises a connecter connected to the first plug of an outmost light emitting diode of the light chain, the connector electrically connects the outer end of the first electrode to the first outer end of the third electrode of the outmost light emitting diode.

7. The light chain of claim 1, wherein for each light emitting diode, the packaging layer is spherical, and the light emitting diode chip is arranged at a center of the packaging layer.

8. The light chain of claim 1, wherein each light emitting diode further comprises a plurality of granules, the plurality of granules is dispersed in the packaging layer or arranged on an emitting surface of the light emitting diode chip for enhancing diffusion of the light emitting diode.

9. The light chain of claim 1, wherein for each light emitting diode, a plurality of diamond powders are dispersed in the packaging layer.

10. A light emitting diode, comprising:
    a light emitting diode chip having a pair of poles;
    a packaging layer encapsulating the light emitting diode chip;
    a first electrode having an inner end received in the packaging layer and electrically connected to a first of the pair of poles of the light emitting diode chip, and an outer end extending through the packaging layer to the outside;
    a second electrode having an inner end received in the packaging layer and electrically connected to a second of the pair of poles of the light emitting diode chip, and an outer end extending through the packaging layer to the outside; and
    a third electrode extending through the packaging layer, the third electrode having a first outer end located at the outside of the packaging layer and a second outer end located at the outside of the packaging layer;
    wherein the outer end of the first electrode and the first outer end of the third electrode cooperatively form a first plug; the outer end of the second electrode and the second outer end of the third electrode cooperatively form a second plug; the first plug is configured to attach to a second plug of an adjacent light emitting diode.

11. The light emitting diode of claim 10, wherein the first electrode, the second electrode, and the third electrode are parallel to each other.

12. The light emitting diode of claim 11, wherein the first and second electrodes are collinear, the inner ends of the first and second electrodes face each other and spaced a distance from each other.

13. The light emitting diode of claim 10, wherein the light emitting diode chip is arranged on the second electrode, and the first electrode is connected to the light emitting diode chip by wire bonding.

14. The light emitting diode of claim 10, wherein the outer end of the first electrode and the first outer end of the third electrode of the light emitting diode are assembled in a first holder; the outer end of the second electrode and the second outer end of the third electrode of the light emitting diode are assembled in a second holder; the second holder of the light emitting diode is configured to receive the first holder of the adjacent light emitting diode.

15. The light emitting diode of claim 10, wherein the packaging layer is spherical, and the light emitting diode chip is arranged at a center of the packaging layer.

16. The light emitting diode of claim 10, further comprising a plurality of granules dispersed in the packaging layer or arranged on an emitting surface of the light emitting diode chip for enhancing diffusion of the light emitting diode.

17. The light emitting diode of claim 10, wherein a plurality of diamond powders are dispersed in the packaging layer.

\* \* \* \* \*